United States Patent [19]
Briggs

[11] Patent Number: 5,103,112
[45] Date of Patent: Apr. 7, 1992

[54] APPARATUS FOR GENERATING CONTROL PULSES OF VARIABLE WIDTH, AS FOR DRIVING DISPLAY DEVICES

[75] Inventor: George R. Briggs, Princeton, N.J.

[73] Assignee: Thomson, S.A., Paris, France

[21] Appl. No.: 620,683

[22] Filed: Dec. 3, 1990

[51] Int. Cl.[5] .............................................. H03K 5/04
[52] U.S. Cl. ............................... 307/265; 307/269; 307/578; 307/482; 328/58; 377/105
[58] Field of Search ............... 307/265, 269, 448, 453, 307/482, 578, 267, 268; 328/58, 63, 72; 377/20, 52, 71, 74, 79, 110, 105, 121; 340/793, 805; 341/53

[56] References Cited

U.S. PATENT DOCUMENTS

| | | | |
|---|---|---|---|
| 3,626,210 | 12/1971 | Spence | 307/265 |
| 3,654,441 | 4/1972 | Bharali | 377/114 |
| 3,836,858 | 9/1974 | Kitano | 307/265 |
| 3,840,815 | 10/1974 | Masters | 307/265 |
| 4,428,051 | 1/1984 | Kuboki et al. | 377/75 |
| 4,742,346 | 5/1988 | Gillette et al. | 340/793 |
| 4,766,430 | 8/1988 | Gillette et al. | 340/973 |
| 4,877,974 | 10/1989 | Kawai et al. | 307/269 |
| 4,931,751 | 6/1990 | Keller et al. | 341/53 |
| 5,017,914 | 5/1991 | Uchida et al. | 340/793 |
| 5,038,139 | 8/1991 | Fujisawa et al. | 340/805 |

Primary Examiner—Stanley D. Miller
Assistant Examiner—Tai V. Duong
Attorney, Agent, or Firm—Joseph S. Tripoli; Eric P. Herrmann; Lester L. Hallacher

[57] ABSTRACT

A variable width pulse generator includes a plurality of logic stages which are coupled cascade. Each stage is arranged to select one of a plurality of clock signals of differing phase applied thereto responsive to particular bits of a data word defining the pulse width. All of the stages are initially disabled by a precharge pulse occurring at the beginning of each variable pulse interval. The successive stages are enabled by the occurrence of a clock pulse of a clock signal selected by the previous stage. The lastmost stage provides an output corresponding to the width pulse.

15 Claims, 5 Drawing Sheets

APPARATUS FOR GENERATING CONTROL PULSES OF VARIABLE WIDTH, AS FOR DRIVING DISPLAY DEVICES

The field of this invention relates generally to variable width pulse generators. It has particular application for providing control pulses with relatively fast transitions using relatively slow devices, as for example amorphous silicon thin-film transistors. One application of the invention is in the driver circuitry of liquid crystal displays having its drive electronics integrated on the display matrix substrate.

BACKGROUND OF THE INVENTION

Frequently it is desired to generate variable width pulses with a minimal amount of circuitry. For example, in certain liquid crystal display (LCD) devices, digital-to-analog converter circuits are formed using variable width pulse generators. Display information represented by binary numbers are converted into variable width pulses which pulses are used to control the conduction times of switching transistors. A ramp voltage is applied to one electrode of the switching transistor, the other electrode being coupled to a display element. The transistor is conditioned to conduct at predetermined intervals and is turned off as a function of the variable width pulse. At the time the transistor is turned off, the ramp voltage, and thus the potential applied to the display element is proportional to the binary value controlling the pulse width. (See for example U.S. Pat. Nos. 4,742,346 and 4,766,430 Gillette et al. which are incorporated herein by reference.)

Display devices of this type may include many hundreds of such digital-to-analog converters and thus many hundreds of variable width pulse generators, requiring that such circuit elements be parts efficient. In addition, the circuitry may be fabricated with material having low carrier mobility such as amorphous silicon. In this latter instance special circuit configurations are necessary to overcome speed limitations incurred by the low carrier mobility.

Typically variable width pulse generators are implemented with programmable counters. Consider that the picture information is represented by eight bit binary words, and that the maximum variable pulse width is 50 $\mu$sec (approximating the active portion of a video line). The incremental variation of the pulses is $50/2^8$ $\mu$sec or approximately 0.2 $\mu$sec. To realize this resolution with a counter type variable pulse generator requires a counter clock frequency of 5 MHz. However, it is not currently possible to fabricate a practical programmable counter that will operate at 5 MHz with amorphous silicon. Thus there is a need for an alternative type of variable width pulse generator.

SUMMARY OF THE INVENTION

The present invention is directed to a variable width pulse generator incorporating a pipelined arrangement of logic stages, each stage of which is responsive to two bits of an n-bit data word representing the desired variable width control pulse. A plurality of clocks of different phase are coupled to each stage, one of which phases is selected, according to the logic level of the bits applied to the respective stage, to enable the next successive stage. An output terminal of the lastmost stage is precharged to a first logic level at the beginning of each pulse interval, and reset to a second logic level substantially coincident with a transition of the clock phase selected by the last most stage.

CROSS REFERENCE TO RELATED APPLICATIONS

Application Ser. No. 07/620,681 (RCA 85,676) filed concurrently herewith by Roger G. Stewart and George R. Briggs entitled "Time Vernier Pulse Width Circuits", describes circuitry which can be used with the present invention. The disclosure of this invention is incorporated herein by reference.

DETAILED DESCRIPTION

Figure 1:
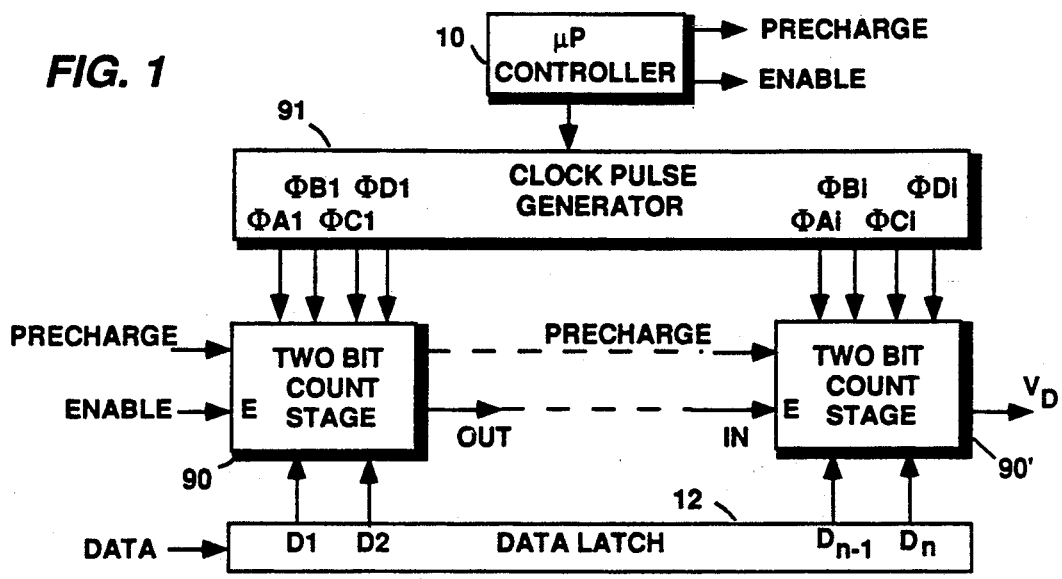
FIG. 1 is a block diagram of a variable width pulse generator embodying the present invention.
Figure 3:
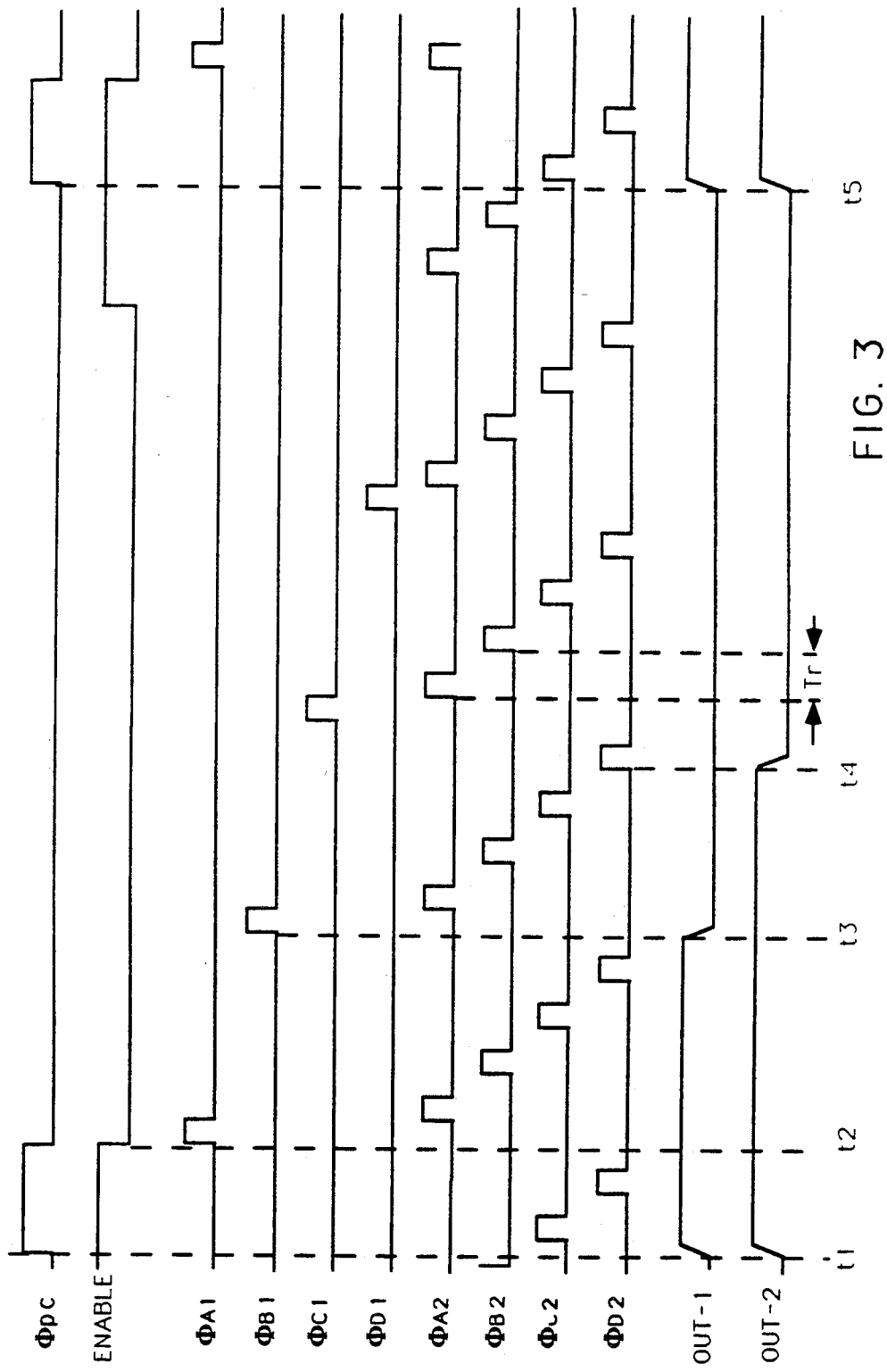
FIG. 3 is a waveform diagram useful for describing the operation of the FIG. 2 circuitry.

FIG. 1 shows the general configuration of a variable width pulse generator embodying the present invention. The system is controlled by a controller 10 which establishes the overall pulse timing and provides a master clock signal to a clock pulse generator 91. The controller also provides precharge pulses, at the beginning (or end) of each variable width pulse interval, and an enable signal to initiate a timing cycle. The general timing relationships of the enable and precharge, $\phi$pc, signals are illustrated in FIG. 3.

The clock pulse generator provides i sets of four phase clock signals $\phi$Ai, $\phi$Bi, $\phi$Ci and $\phi$Di, where i is equal to one half the number of data bits representing the variable width pulse. The lower numbered sets of clock signals are associated with data bits of more bit significance and the higher numbered sets are associated with data bits of lower significance. In a pulse interval, the number of pulses in a clock signal ($\phi A_i$) of a particular set of clock signals $\phi$i is at least four times the number of pulses in a clock signal ($\phi A_{i-1}$) of the next ordinally number set $\phi(i-1)$.

Each set of clock signals is applied to a two-bit count stage 90. Each stage has input terminals for applying two successive data bits Dn, Dn−1, of the data word representing the variable width pulse, a precharge pulse and an enable pulse. Each stage also has an output terminal. The enable input terminal of each successive stage is coupled to the output terminal of the preceding stage.

At the beginning of each pulse period the output terminal of each stage is precharged to a level which, as applied to the enable input terminals of successive stages, disables the successive stages. An enabling level is then applied to the first stage, which, responsive to the two most significant bits of the data word, selects one of the phases of the clock signals applied thereto. Responsive to a transition of the selected clock phase, the output terminal is set to an enabling potential, thereby enabling the next successive stage. This process ripples down the successive stages until the lastmost stage sets its output potential to the enabling level. The pulse of variable width is provided at the output terminal of the lastmost stage.

FIG. 3 shows clock waveforms which illustrate the general timing of a two-stage variable width pulse generator. In FIG. 3 the signal $\phi pc$ represents the precharge signal having a precharge pulse occurring between times t1 and t2. The waveforms labeled Out-1 and Out-2 represent the output potentials of the first and second stages, respectively. A high enable signal, and thus a high output signal disables the stage to which it is applied.

At time t1 the precharge pulse precharges the output terminals OUT-1, OUT-2 of both stages. Thus the second stage is disabled. The first stage is disabled by virtue of the external enable signal ENABLE being high. During the precharge interval the data bits may be established in the data latch. At time t2 the enable signal goes low enabling the first stage. In FIG. 3 it is assumed that the data bits applied to the first stage select clock phase $\phi B1$ from among the phases $\phi A1$, $\phi B1$, $\phi C1$ and $\phi D1$. The leading edge of the first pulse of the $\phi B1$ clock phase causes the output signal OUT-1 of the first stage to change state (time t3). At time t3 the second stage is enabled and will select, according to the data bits applied thereto, one of the clock phases $\phi A2$, $\phi B2$, $\phi C2$ and $\phi D2$. In the example of FIG. 3 it is assumed that the second stage selects clock signal $\phi D2$. The first pulse of the clock signal $\phi D2$ occurring after the second stage is enabled (i.e., after time t3), will cause the output signal OUT-2 of the second stage to go low (time t4). The variable width pulse provided in this example may be defined as either the positive going pulse from between times t1 and t4, which has a fixed leading edge (t1) and a variable trailing edge (t4), or as the negative going pulse between times t4 and t5 which has a variable leading edge t4, and a fixed trailing edge t5.

Note in the FIG. 3 arrangement, the incremental resolution of the variable width pulse is determined by the relative phase delay of the $\phi 2$ clock signals, for example by the time interval Tr, between the leading edges of clock signals $\phi A2$ and $\phi B2$. The time interval between phases of the next lower ordinally numbered clock signals (e.g., $\phi A1$ and $\phi B1$) is four times Tr. This timing relationship holds for any number of stages. That is, the relative time delay among any set of clock signals is one quarter of the relative time delay among the next lower ordinally numbered set of clock signals.

Figure 2:
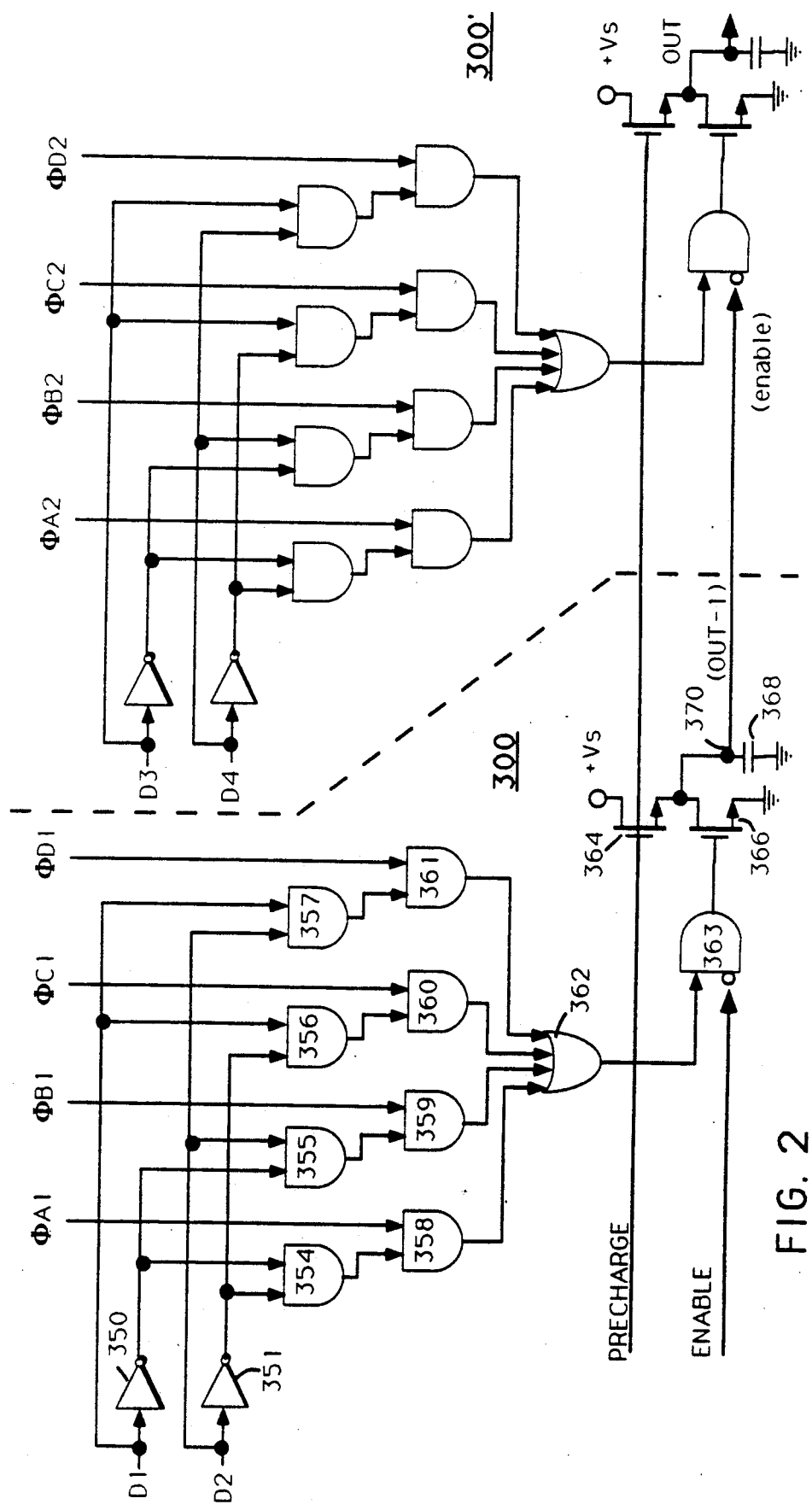
FIG. 2 is a logic schematic of one embodiment of the count stages which may be utilized in the generator shown in FIG. 1.

FIG. 2 illustrates a first embodiment of the two-bit count stages wherein two stages are cascade connected for pipelined operation. The first stage 300 is responsive to the more significant data bits D1, D2 and the lower ordinally numbered clock signal set $\phi A1$, $\phi B1$, $\phi C1$ and $\phi D1$. The second stage 300' is responsive to the two next lesser significant data bits D3, D4 and the clock signals $\phi A2$, $\phi B2$, $\phi C2$ and $\phi D2$. Note both stages are responsive to a common precharge signal. The first stage 300 is responsive to an external enable signal and the second stage (enable input) is responsive to the output 370 of the first stage.

In the two-bit count stage 300 the two data bits D1 and D2 and their complements are applied to four two input AND gates 354–357 respectively in the following combinations, $\overline{D1}\,\overline{D2}$; $\overline{D1}\,D2$; $D1\,\overline{D2}$ and $D1\,D2$.

Output signal from the AND gates 354–357 are coupled respectively to first input terminals of four further AND gates 358–361. The clock signals $\phi A1$, $\phi B1$, $\phi C1$ and $\phi D1$ are respectively coupled to second input terminals of the AND gates 358–361 which respectively provide output logic signals according to the Boulean functions;

$\overline{D1}\cdot\overline{D2}\cdot\phi A1$; $\overline{D1}\cdot D2\cdot\phi B1$; $D1\cdot\overline{D2}\cdot\phi C1$; $D1\cdot D2\cdot\phi D1$.

Referring to FIG. 3 and the clock signals $\phi A1$, $\phi B1$, $\phi C1$, $\phi D1$, it can be seen that the pulse width of greatest duration is produced by selecting the clock signal $\phi D1$. In addition, the largest value (1,1) which can be represented by a two bit data value corresponds to the largest variable width pulse. Thus the value (1,1) is arranged to select the $\phi D1$ clock phase, that is AND gate 361 is conditioned by data bits D1 and D2 exhibiting logic one states to select the clock signal $\phi D1$. The shortest width pulse is generated by selecting clock signal $\phi A1$. The AND gate 358 is therefore conditioned to select clock signal $\phi A1$ when the data bits D1, D2 exhibit logic zeroes and so forth.

Logic output signals from the AND gates 358–361 are coupled to respective input terminals of a four-input OR gate 362 which produces a logic high level whenever a pulse of the selected clock signal occurs. The output terminal of the OR gate is coupled to one input terminal of an AND circuit 363. The enable signal is coupled to an inverting input of the AND circuit 363. Thus only when the enable signal is low, is the AND circuit 363 conditioned to pass the logic signal provided by the OR gate 362.

The output of the AND circuit 363 is coupled to the gate of a pull-down transistor, 366, having its principal conduction path coupled between an output terminal 370 and ground potential. Transistor 366 is rendered conducting by logic high levels applied to its gate electrode. A further transistor 364 has its gate electrode coupled to the precharge signal and its principal conduction path coupled between the output terminal 370 and a source of positive supply potential (logic high level) +VS. A capacitor 368 is coupled between the output terminal 370 and ground.

At the beginning of a variable pulse interval transistor 364 conducts responsive to the precharge pulse, and charges the capacitor 368 to a logic high level. The transistor 364 is then turned off leaving the capacitor 368 and the output terminal charged at the logic high level. After the precharge interval the enable signal goes low enabling the AND circuit 363 to pass signal provided by the OR gate 362. Upon the occurrence of the first pulse of the selected clock signal (after circuit 363 is enabled), the AND circuit 363 provides a logic high output signal rendering transistor 366 conductive. The transistor 366 discharges the capacitor 368, and the output terminal, providing the trailing transition of the variable width pulse. Note when terminal 370 goes low, the successive stage 300' is enabled to select from the clock phases $\phi A2$, $\phi B2$, $\phi C2$ and $\phi D2$ according to the logic values of the lesser significant data bits D3 and D4.

Figure 4:
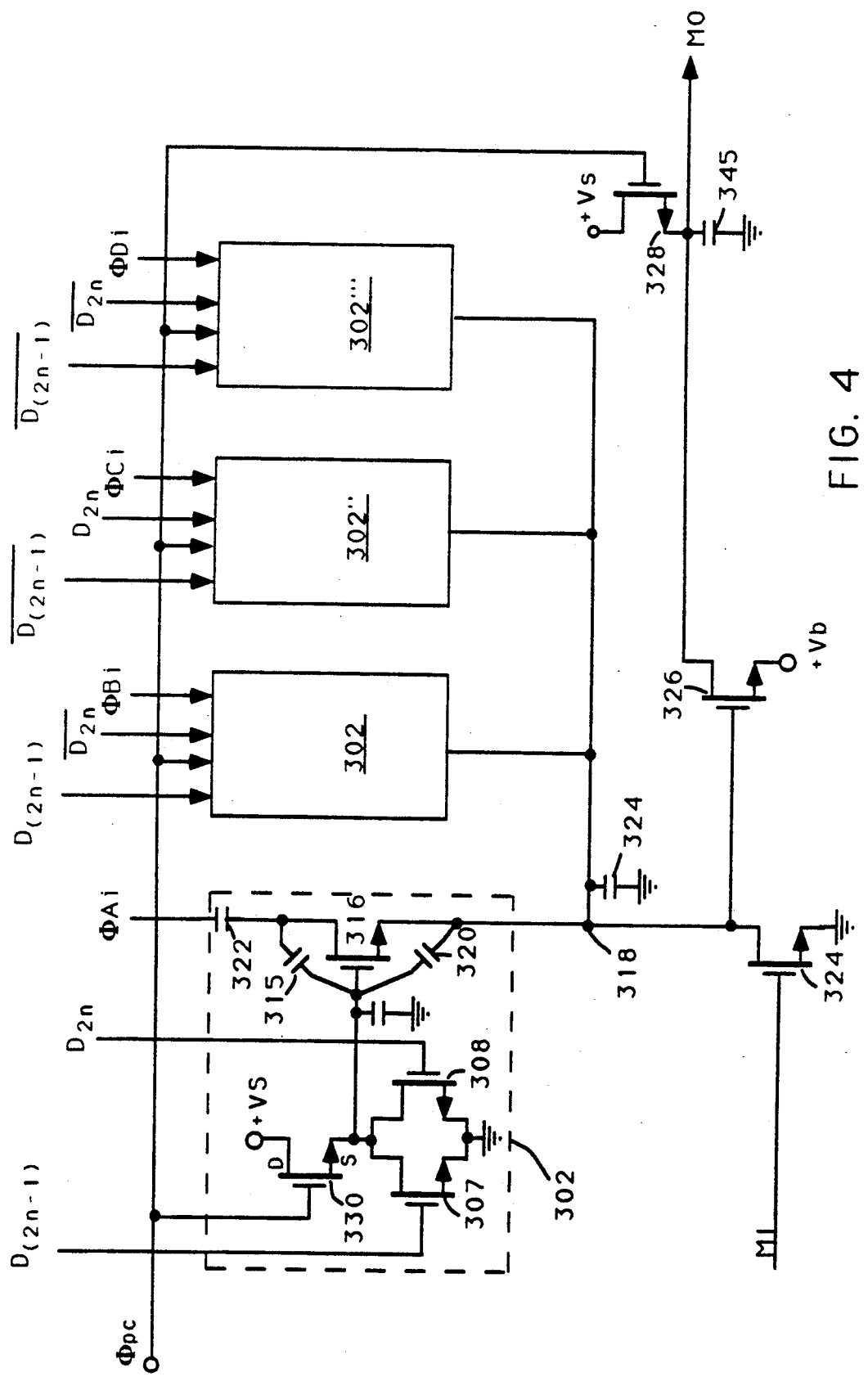
FIGS. 4 and 6 are schematic diagrams of alternative embodiments of the count stages illustrated in FIG. 1.

FIG. 4 illustrates a two-bit count stage circuit which performs a similar function to stage 300 in FIG. 2. In FIG. 4 the function of the AND gates 354 and 358 of FIG. 2 is performed by the circuit 302. Similarly, the functions of the AND gates (355, 359), (356, 360) and (357, 361) are respectively performed by the circuits 302', 302'' and 302'''. The output signals provided by the circuits 302 are wire ORed at node 318. The enable/disable function is provided by the transistor 324 which clamps the node 318 to ground potential in the disable mode. The transistors 326 and 328 and capacitor 345 perform similar functions as transistor 366 and 364 and capacitor 368 of FIG. 2.

The FIG. 4 arrangement is designed to provide maximum processing speed using transistors having relatively small geometry and/or low carrier mobility. This is accomplished by utilizing dynamic or precharging techniques and avoiding ratioed logic devices. That is, for transistors connected in series between relatively positive and negative supply potentials, during critical timing intervals no more than one of the series connected transistors is conducting (except for transistor 324).

Consider the circuit 302 (circuits 302', 302" and 302''' are all similar to circuit 302). Circuit 302 includes an AND circuit comprising pass transistor 316 which passes a logic high level to its output (NODE 318) when a high level is concurrently applied to its two input terminals (the gate and drain electrodes). The drain electrode is coupled to the clock signal $\phi A1$ and the gate electrode is coupled to the output of a precharge NOR or combinatorial logic circuit. The precharge NOR circuit comprises a pull-up transistor 330 coupled in series with the parallel connection of pull-down transistors 307 and 308. The gate electrodes of the pull-down transistors are arranged to receive respective data bits, e.g., D1 and D2, and the gate electrode of the pull-up transistor 330 is coupled to the precharge signal. During the precharge interval the pull-up transistor is rendered conductive to charge the NOR circuit output node to a logic high level. At the same time the logic values of the data bits are established on the gate electrodes of transistors 307 and 308. At the end of the precharge interval the pull-up transistor 330 is turned off leaving the output node of the NOR circuit charged high if both data bits exhibit a logic low. If one or both of the data bits is a logic high, one or both of the transistors 307 and 308 conduct during the precharge interval, and shunt a portion of the charging current to ground and reducing the precharge output potential of the NOR circuit. When the pull-up transistor turns off, the reduced output potential of the NOR circuit is easily pulled to a logic low level by the one of the transistors 307, 308 that is conditioned to conduct. The Boolean function performed by the circuit 302 is given by $$\phi A1 \cdot (\overline{D1+D2}) = \phi A1 \cdot \overline{D1} \cdot \overline{D2}$$

which is the same as the function provided by the AND gate 358 of the FIG. 2 embodiment.

Transistor 316 includes interelectrode capacitances 315 and 320. With transistor 316 rendered nonconductive, a portion of the clock signal $\phi A1$ may be coupled to node 318, via the series combination of the capacitors 315 and 320, tending to inadvertently turn on transistor 326. In order to preclude such turn on, the source electrode of transistor 326 may be biased above ground potential by a supply potential $+Vb$. Raising the potential applied to the source electrode of the transistor 326 raises the potential level which must be applied to its gate before it will turn on. Thus by applying the relatively more positive potential $V_B$ to the source electrode of transistor 326, the noise immunity of the system is increased. The amplitude of the supply $V_B$ is a value which influences the lower level of the output signal. Since the output signal must be capable of exhibiting a logic low value, the amplitude of $V_B$ must be less than the maximum allowed for a logic low value and is typically selected at a level slightly less than the threshold potential of transistor 324.

In designing transistor 316, the value of the interelectrode capacitance 320 is minimized to preclude the above mentioned clock coupling to node 318. However, the value of the interelectrode capacitance 315 is enhanced to induce clock coupling to the gate electrode of transistor 316. Such coupling provides a voltage boost to a logic one level applied to the gate, thereby enhancing the conduction properties of transistor 316 when it is turned on.

During intervals when the stage is to be disabled, transistor 324 is biased into conduction to clamp node 318 to ground potentia. During such intervals, the transistor 316 of one of the circuits 302—302''' will conduct current to node 318 tending to raise its potential. In order to minimize the size of transistor 324, and still insure that node 318 is maintained at a logic low value during the disable mode, the current available to charge node 318, via transistor 316, is limited by capacitively coupling, rather than direct coupling, the clock signals to the drain electrodes of the respective transistors 316. In addition, the leading transitions of the pulses of the clock signals are provided with relatively long rise times. In fact, it has been found to be advantageous to use clock signals with sawtooth like pulses as illustrated in FIG. 5.

Figure 5:
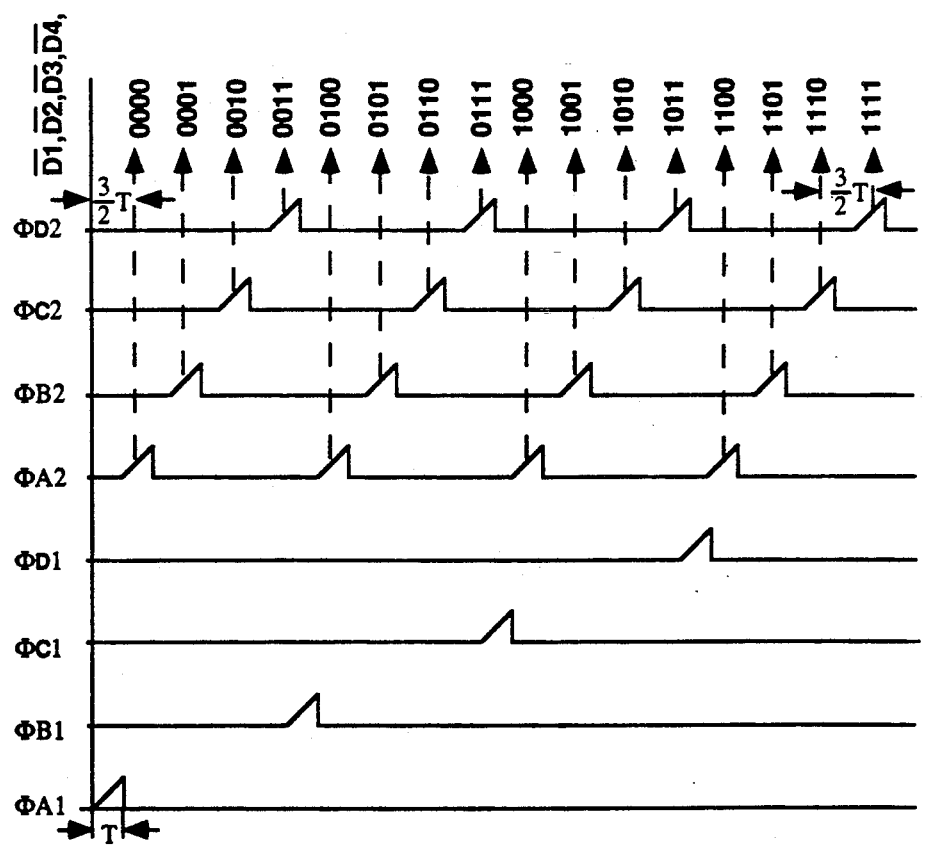
FIG. 5 is a waveform diagram of respective clock signals applied to the FIG. 4 circuitry.

FIG. 5 shows examplary waveforms for the eight clock signals of a two stage variable width pulse generator. The vertical dashed lines indicate the relative delay times of the trailing edge of the variable width pulses represented by the associated four-bit binary values.

It may be noted that aneight bit variable width pulse generator of the type described above requires a semmingly excessive number (16) of clock lines. However, in the environment of LCD scanning circuitry fabricated directly on the display matrix substrate where hundreds of such generators are included in parallel, the added complication of the (e.g., 16) clock lines is insignificant, since the same clock signals signals are coupled to all of the generators.

Figure 6:
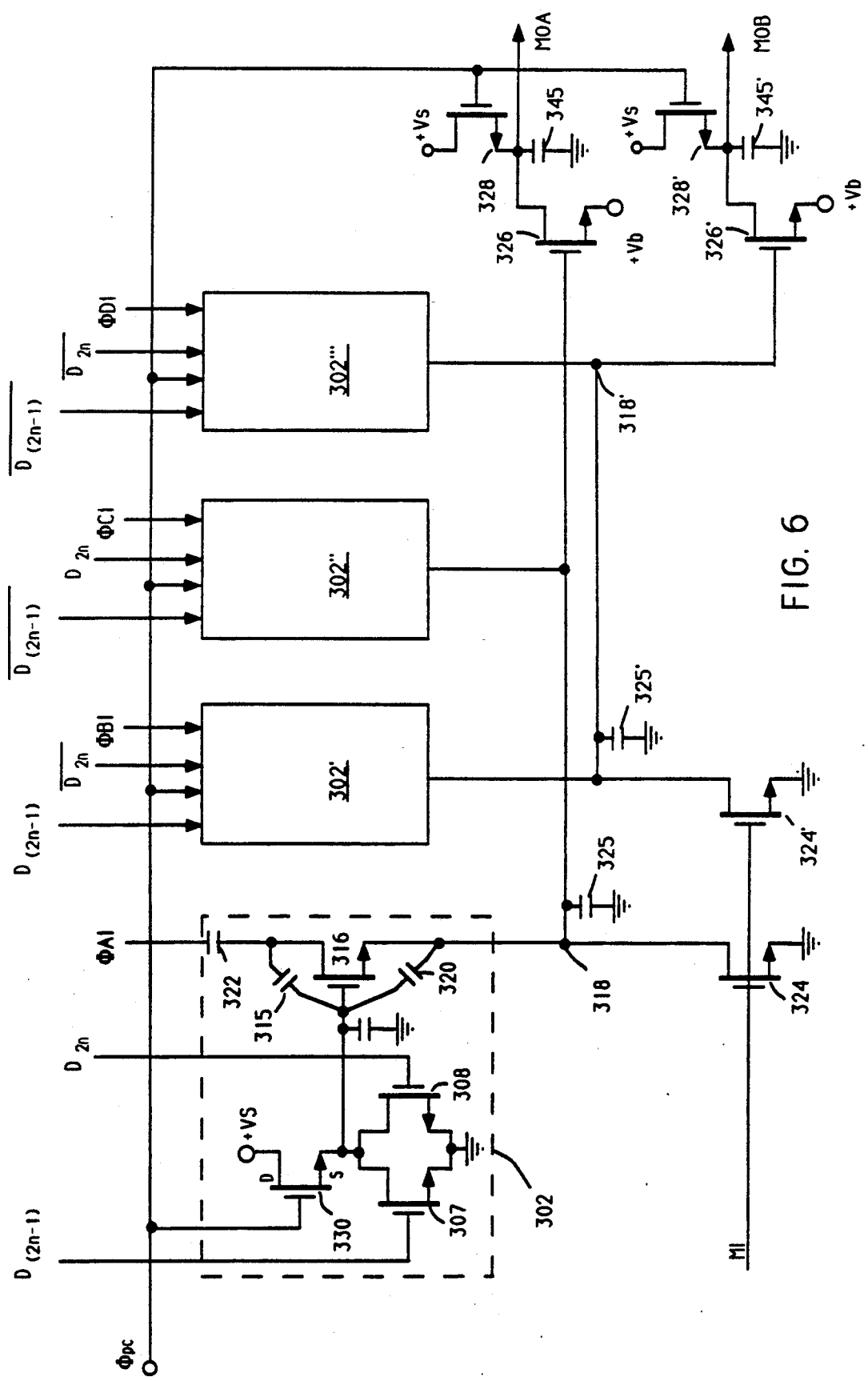

FIG. 6 shows an embodiment which provides two out pulses MOA and MOB, a so-called "split-bus" embodiment. As indicated by like reference numbers, the stages 302 to 302" are identical to the similarly numberer stages of the FIG. 4 embodiment. The FIG. 6 embodiment includes additonal transistors 324', 326' and 328', which respectively function identically to transistors 324, 326 and 328 of FIG. 4. Also, stages 302 and 302" are connected to node 318, while stages 302' and 302''' are connected to node 318'. Accordingly, phases $\phi A1$ and $\phi C1$ control transistor 326 and provide the output MOA via transistor 328, while clock phases $\phi B1$ and $\phi D1$ control transistor 326', and provide the output MOB via transistor 328'. Except for these differences, the FIG. 6 embodiment is similar to the FIG. 4 embodiment and utilizes the waveforms illustrated in FIG. 5. The advantage of the FIG. 6 embodiment is the provision of two output pulses MOA and MOB, which are useful with several embodiments of the time vernier circuit described in patent application Ser. No. 07/620,681 (RCA 85,676) incorporated by reference hereinabove.

Armed with the foregoing disclosure one skilled in the art of circuit design may ralize further designs without straying from the spirit of the invention. For example, by doubling the number of phases in a clock signal set and adding appropriate AND gates to the FIG. 2 system, one may provide four bit count stages, etc.

What is claimed is:

1. A variable width pulse generator comprising:
   a source of n-bit data words representing variable width pulses, n being an integer;
   a clock generator for poviding n/q sets of 2q clock signals of 2q phases, where q is an integer power of two;
   a plurality n/q of count stages respective ones of which are coupled to different ones of said n/q sets of 2q clock signals, each of said count stages having an enable input terminal, an output terminal and q data input terminals for applying q bits of said n-bit data work, said plurality of count stages being coupled in cascade with the enable input terminal of a respective count stage coupled to the output terminal of the immediately preceding count stage and the output terminal of the lastmost count stage providing said variable width pulses, each count stage including means for establishing its output terminal at a first state at the beginning of a pulse interval, and means responsive to the q data bits applied to such count stage for selecting one of said 2q clock signals applied to such count stage for establishing said output terminal at a second state, and wherein the bits of said data word are applied to the count stages in descending order of bit significance from the firstmost to the lastmost count stages in said cascade connection.

2. The generator set forth in claim 1 wherein the sets of clock signals are ordinally numbered, with the lowest numbered set being coupled to the firstmost count stage and the highest ordered set being coupled to the lastmost count stage, and wherein the clock signals of each higher numbered set of clock signals have a period which is substantially ½q the period of the next lower numbered set.

3. The generator set forth in claim 1 wherein the means responsive to the q data bits for selecting one of said 2q clock phases comprises:
   a combinatorial logic circuit having q input terminals coupled to said q data bits and having an output terminal; and
   a pass transistor having a control electrode coupled to said output terminal of said combinational logic circuit, and a principal conduction path having first and second ends, the first end of which is coupled to one of said 2q clock signals.

4. The generator set forth in claim 3 including a capacitor for coupling the principal conduction path of said transitor to said one of said 2q clock signals.

5. The generator set forth in claim 3 wherein said means for selecting one of said 2q clock signals includes 2q pass transistors having respective second ends coupled to a common node, respective first ends coupled to respective ones of said 2q clock signals, and respective control electrodes coupled to the output terminals of respective combinatorial logic circuits.

6. The generator set forth in claim 5 further including a further transistor having a control electrode coupled to said enable input terminal and a principal conduction path coupled between said common node and a source of supply potential; and
   an output transistor having a control electrode coupled to said common node and a principal conduction path coupled between said output terminal of the count stage and a further source of supply potential.

7. The generator set forth in claim 6 wherein each of said pass transistors includes a coupling capacitor coupled between its respective control electrode and the first end of its principal conduction path for coupling a portion of the clock signal to its control electrode.

8. The generator set forth in claim 3 wherein said combinatorial logic circuit comprises a precharge NOR circuit having a selectively conductive pull-up transistor responsive to a precharge signal, and a plurality of pull-down transistors responsive to said q data bits.

9. A variable width pulse generator comprising:
   a source of n-bit data words representing variable width pulses, n being an integer;
   a clock generator for providing n/2 ordinally numbered sets of 4 clock signals of 4 phases, the phases of the clock signals of at least some of said n/2 sets being successively offset by 90 degrees within a set, and the clock signals of successively higher numbered sets providing pulses at successively higher rates;
   a plurality n/2 of count stages respective ones of which are coupled to successively higher numbered sets of said clock signals, each of said count stages having an enable input terminal, and output terminal and 2 data input terminals for applying 2 bits of said n-bit data word, said plurality of count stges being coupled in cascade with the enable input terminal of a respective count stage coupled to the output terminal of the immediately prceding count stage and the output terminal of the lastmost count stage providing said variable width pulses, each count stage including means for establishing its output terminal at a first state at the beginning of a pulse interval, and means responsive to the 2 data bits applied to such count stage for selecting one of said 4 clock signals applied to such count stage for establishing said output terminal at a second state, and wherein the bits of said data word are applied to the count stages in descending order of bit significance from the firstmost to the lastmost count stages in said cascade connection.

10. The generator set forth in claim 9 wherein each count stage comprises:
    first, second, third and fourth transistors, having respective first electrodes coupled to receive respective ones of clock signals of a set of clock signals, having respective second electrodes coupled to a common node and having respective control electrodes;
    first, second, third and fourth logic circuits, having respective first and second input terminals coupled for receiving two bits, D1, D2, of said n-bit data word for respectively providing output signals to the control electrodes of the first, second, third and fourth transistors according to the Boolean logic functions $\overline{D1D2}$ $D1\overline{D2}$, $\overline{D1}D2$, and $D1D2$;
    a fifth transistor, having a control input terminal coupled to said enable input terminal, and a principal conduction path coupled between said common node and a point of supply potential; and
    an output transistor having a control input terminal coupled to said common nod, and a principal conduction path coupled between said output terminal and a point of supply potential.

11. The generator set forth in claim 10 further including respective boost capacitors coupled between the control and first electrodes of each of said first, second, third and fourth transistors.

12. The generator set forth in claim 11 wherein the first electrodes of each of said first, second, third and fourth transistors are coupled to said clock generator by first, second, third and fourth coupling capacitors respectively.

13. The generator set forth in claim 10 wherein the first electrodes of each of said first, second, third and fourth transistors are coupled to said clock generator by first, second, third and fourth coupling capacitors respectively.

14. The generator set forth in claim 10 wherein each of said first, second, third and fourth logic circuits, include precharge means, responsive to a common precharge signal for setting respective output terminals of said first, second, third and fourth logic circuits at a first logic state during a percharge interval, and include respective further transistors, responsive to said data bits for setting said respecitve output terminals of said first, second, third and fourth logic circuits to a second logic state during intervals, at least in part, which are exclusive of said precharge intervals.

15. A variable width pulse generator comprising:
a source of n-bit data words representing variable width pulses, n being an integer;

a clock generator for priviving n/q sets of clock signals, where q is an integer less than n and greater than 1, each set of clock signals includes a plurality of pulsed signals of different phases and the clock signals of each set have a like frequency which frequency differs from the frequency of the clock signals of every other set;

a plurality n/q of count stages respective ones of which are coupled to different ones of said n/q sets of clock signals, each of said count stages hving an enable input terminal, an output terminal and q data input terminals for applying q bits of said n-bit data word, said plurality of count stages being coupled in cascade with the enable imput terminal of a respective count stage coupled to the output terminal of the immediately preceding count stage and the output terminal of the lastmost count stage providing said variable width pulses, each count stage including means for establishing its output terminal at a first state at the beginning of a pulse interval, and means responsive to the q data bits applied to such count stage for selecting one of said clock signals applied to such count stage for establishing said output terminal at a second state, and wherein the bits of said data word are applied to the count stages in descending order of bit significance from the firstmost to the lastmost count stages in said cascade connection.

* * * * *